United States Patent
Iwaya

(10) Patent No.: US 9,973,188 B2
(45) Date of Patent: May 15, 2018

(54) SWITCH DRIVING DEVICE AND SWITCH DRIVING METHOD

(71) Applicant: TDK Corporation, Tokyo (JP)

(72) Inventor: Kazuki Iwaya, Tokyo (JP)

(73) Assignee: TDK Corporation (JP)

( * ) Notice: Subject to any disclaimer, the term of this patent is extended or adjusted under 35 U.S.C. 154(b) by 0 days. days.

(21) Appl. No.: 15/265,914

(22) Filed: Sep. 15, 2016

(65) Prior Publication Data

US 2017/0111040 A1    Apr. 20, 2017

(30) Foreign Application Priority Data

Oct. 15, 2015 (JP) .................................. 2015-203827

(51) Int. Cl.
| | |
|---|---|
| H03K 17/04 | (2006.01) |
| H03K 17/16 | (2006.01) |
| H03K 17/567 | (2006.01) |
| H03K 19/0175 | (2006.01) |
| H03K 17/06 | (2006.01) |

(52) U.S. Cl.
CPC ......... *H03K 17/567* (2013.01); *H03K 17/063* (2013.01); *H03K 17/162* (2013.01); *H03K 19/017509* (2013.01); *H03K 2017/066* (2013.01)

(58) Field of Classification Search
CPC .. H03K 17/567; H03K 17/063; H03K 17/162; H03K 19/017509; H03K 2017/066
USPC ............. 327/108–112, 365–508; 326/22–27, 326/81–87; 1/1
See application file for complete search history.

(56) References Cited

U.S. PATENT DOCUMENTS

| | | | | |
|---|---|---|---|---|
| 4,721,869 A | * | 1/1988 | Okado | H03K 17/0828 326/14 |
| 5,485,341 A | * | 1/1996 | Okado | H03K 17/0822 361/79 |
| 5,852,538 A | * | 12/1998 | Masui | H03K 17/0828 361/18 |
| 6,333,665 B1 | * | 12/2001 | Ichikawa | H03K 17/168 327/389 |

(Continued)

FOREIGN PATENT DOCUMENTS

| | | |
|---|---|---|
| JP | 4916964 B2 | 4/2012 |
| JP | 4945218 B2 | 6/2012 |

*Primary Examiner* — Brandon S Cole
(74) *Attorney, Agent, or Firm* — Harness, Dickey & Pierce, P.L.C.

(57) ABSTRACT

There are provided a switch driving device and a switch driving method capable of preventing a self-turn-on phenomenon. The switch driving device includes: a first signal output unit configured to output a pulsed first driving signal from a first output terminal thereof; a second signal output unit configured to output a pulsed second driving signal to a control terminal of a switching element from a second output terminal thereof; and a negative power supply generating unit configured to generate a negative voltage relative to a ground voltage and bias a low level of the second driving signal toward a negative side by the negative voltage. The negative power supply generating unit includes: a first capacitor configured to store charge by the first driving signal; and a second capacitor configured to generate the negative voltage across terminals thereof by the transfer of the charge from the first capacitor.

8 Claims, 8 Drawing Sheets

(56) References Cited

U.S. PATENT DOCUMENTS

| | | | |
|---|---|---|---|
| 7,724,065 B2 * | 5/2010 | Bayerer | H03K 17/0422 |
| | | | 323/289 |
| 8,018,255 B2 | 9/2011 | Hirao et al. | |
| 2016/0218612 A1 * | 7/2016 | Morimoto | H03K 17/04123 |

* cited by examiner

SWITCH DRIVING DEVICE AND SWITCH DRIVING METHOD

BACKGROUND OF THE INVENTION

1. Field of the Invention

The present invention relates to a switch driving device and a switch driving method for driving a switching element in a power supply device such as a DC-DC converter, for example.

2. Description of the Related Art

As power supply devices such as DC-DC converters, for example, switching power supply devices in which a switching element (semiconductor switch) such as a metal oxide semiconductor field effect transistor (MOSFET) or an insulated gate bipolar transistor (IGBT) is driven by a switch driving device (drive circuit) so as to convert power have been widely used.

In such a switching power supply device, the problem of a self-turn-on phenomenon in which a switching element in an OFF state is mistakenly turned ON may arise, for example, when the switching element is driven at high speed. In this self-turn-on phenomenon, a drain-source voltage in an OFF state sharply rises along with the high-speed driving of the switching element, for example. Charge is thus injected into gate-source capacitance (i.e., the gate-source capacitance is charged) via drain-gate feedback capacitance, thereby increasing a gate voltage to a threshold voltage or higher and thus turning the switching element ON. The occurrence of the self-turn-on phenomenon results in not only deteriorated power conversion efficiency but also, for example, the damage or firing of the switching element in some cases.

A known technique to prevent such a self-turn-on phenomenon is applying a negative voltage to a gate of a switching element in an OFF state so as to bias a gate voltage toward the negative side (see Japanese Patent No. 4945218 or Japanese Patent No. 4916964, for example). Biasing the gate voltage toward the negative side allows the gate voltage to be kept below a threshold voltage even when the amount of charge injected via feedback capacitance is large. Thus, the self-turn-on phenomenon can be effectively prevented from occurring.

SUMMARY OF THE INVENTION

The switch driving device described in the above-described Japanese Patent No. 4945218, however, employs a transformer to generate the negative voltage to be applied to the gate of the switching element. This causes the problems of a larger size of the entire device and an increased cost. Moreover, the switch driving device described in the above-described Japanese Patent No. 4916964 separately requires switching elements (a p-channel MOSFET 107, an n-channel MOSFET 108, and an n-channel MOSFET 109) for controlling the charging and discharging (the storage and emission of charge) of a negative voltage generating capacitor 104. This causes the problems of a complicated circuit configuration and an increased cost.

Furthermore, since a drive voltage of a high-side MOSFET 102 is generated by a bootstrap circuit (a boot diode 113 and a boot capacitor 127) in the switch driving device described in the above-described Japanese Patent No. 4916964, it is difficult to provide on the high side a negative voltage generating circuit similar to that on the low side. Thus, in order to prevent the self-turn-on phenomenon in the high-side MOSFET 102, an insulated negative power supply including a transformer or the like needs to be provided separately.

The latest-generation switching elements, which employ semiconductor such as SiC or GaN instead of conventionally-used Si, are becoming pervasive in recent years. These elements, however, have a higher rate of occurrence for the self-turn-on phenomenon due to their capability of high-speed driving and their low threshold voltage and input and output capacitance. Accordingly, a switch driving device capable of preventing the self-turn-on phenomenon with a simple and compact configuration is demanded also for the purpose of effectively using these latest-generation switching elements.

The present invention has been made in view of the aforementioned problems. It is an object of the invention to provide a switch driving device and a switch driving method capable of preventing the self-turn-on phenomenon with a simple and compact configuration.

(1) An aspect of the present invention provides a switch driving device including: a first signal output unit configured to output a pulsed first driving signal from a first output terminal thereof; a second signal output unit configured to output a pulsed second driving signal to a control terminal of a switching element from a second output terminal thereof on the basis of the input first driving signal; and a negative power supply generating unit configured to generate a negative voltage relative to a ground voltage and bias a low level of the second driving signal toward a negative side by the negative voltage. The negative power supply generating unit includes: a first capacitor configured to store charge by the first driving signal; and a second capacitor configured to generate the negative voltage across terminals thereof by transfer of the charge from the first capacitor.

(2) In the switch driving device in (1) described above, the first signal output unit includes a first transistor having a current exiting terminal and a current entering terminal that is connected to the first output terminal, the first capacitor has one end that is connected to the current entering terminal of the first transistor via the first output terminal, and the second capacitor has one end that is connected to the current exiting terminal of the first transistor.

(3) In the switch driving device in (2) described above, the negative power supply generating unit includes a first diode and a second diode, the first diode has an anode that is connected to the other end of the first capacitor and a cathode that is connected to a ground, the second diode has an anode that is connected to the other end of the second capacitor and a cathode that is connected to the other end of the first capacitor, and a midpoint between the second capacitor and the first transistor is connected to the ground.

(4) In the switch driving device in (3) described above, the second signal output unit includes a second transistor having a current exiting terminal and a current entering terminal that is connected to the second output terminal, and a midpoint between the second capacitor and the second diode is connected to the current exiting terminal of the second transistor.

(5) In the switch driving device in any one of (2) to (4) described above, the negative power supply generating unit includes a limiting resistor provided between the first capacitor and the second capacitor.

(6) Another aspect of the present invention provides a switch driving method performed in a switch driving device including: a first signal output unit configured to output a pulsed first driving signal from a first output terminal thereof; and a second signal output unit configured to output a pulsed second driving signal to a control terminal of a switching element from a second output terminal thereof on the basis of the input first driving signal. The switch driving method includes: storing charge in a first capacitor by the first driving signal; generating a negative voltage relative to a ground voltage across terminals of a second capacitor by transferring the charge from the first capacitor to the second capacitor; and biasing a low level of the second driving signal toward a negative side by the negative voltage.

The switch driving device and the switch driving method according to the present invention can provide an advantageous effect of preventing the self-turn-on phenomenon with the simple and compact configuration.

DETAILED DESCRIPTION OF THE PREFERRED EMBODIMENTS

An embodiment of the present invention will now be described below with reference to the accompanying drawings. Note that the depiction of some components is omitted or simplified in each figure for ease of understanding.

Figure 1:
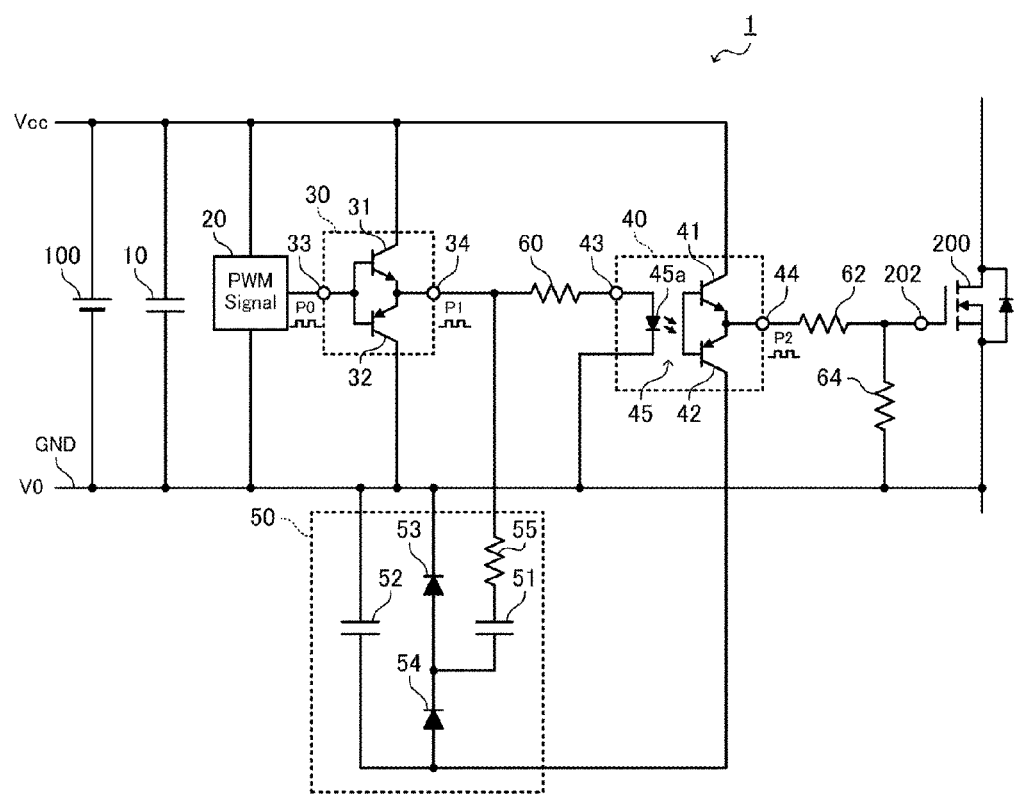
FIG. 1 is a circuit diagram showing a configuration of a switch driving device according to an embodiment of the present invention.

FIG. 1 is a circuit diagram showing a configuration of a switch driving device 1 according to the present embodiment. The switch driving device 1 of the present embodiment is provided to switching power supply devices such as a wide variety of converters or inverters. The switch driving device 1 is configured to drive (i.e., switching between ON and OFF) a switching element 200, which is constructed of a MOSFET, by an input voltage Vcc input from a DC power supply 100 with a negative side thereof being connected to ground GND. As illustrated in FIG. 1, the switch driving device 1 includes an input capacitor 10, a pulse generating unit 20, a first signal output unit 30, a second signal output unit 40, and a negative power supply generating unit 50.

The input capacitor 10 is connected in parallel with the DC power supply 100 and configured to stabilize the input voltage Vcc. The pulse generating unit 20 is configured to generate a pulsed reference signal P0 from the input voltage Vcc in accordance with an instruction from, for example, an external control device (not shown) and then output the pulsed reference signal P0 to the first signal output unit 30. Although the pulse generating unit 20 in the present embodiment is constited by a pulse width modulation (PWM) generator that generates the reference signal P0 in accordance with a PWM method, the reference signal P0 may be generated in accordance with other methods such as a pulse frequency modulation (PFM) method, for example.

The first signal output unit 30 is configured to generate a first driving signal P1, which is a pulsed signal, on the basis of the reference signal P0 input from the pulse generating unit 20 and then output the first driving signal P1 to the second signal output unit 40. Specifically, the first signal output unit 30 is constructed of a push-pull circuit of an NPN transistor 31 and a PNP transistor 32. The first signal output unit 30 also includes a first input terminal 33 and a first output terminal 34.

Bases of the NPN transistor 31 and the PNP transistor 32 are connected to each other, and the midpoint therebetween is connected to the first input terminal 33. Emitters of the NPN transistor 31 and the PNP transistor 32 are connected to each other, and the midpoint therebetween is connected to the first output terminal 34. A collector of the NPN transistor 31 is connected to a positive electrode of the DC power supply 100, and a collector of the PNP transistor 32 is connected to the ground GND. The first input terminal 33 is connected to the pulse generating unit 20 so that the reference signal P0 is input thereto from the pulse generating unit 20. The first output terminal 34 is connected to the second signal output unit 40.

With such configurations, the NPN transistor 31 is in an ON state and the PNP transistor 32 is in an OFF state in the first signal output unit 30 while the pulsed reference signal P0 input to the first input terminal 33 is at a high level (voltage Vd0). Accordingly, the voltage of the first output terminal 34 receives the input voltage Vcc and thus becomes a voltage Vd1 based on the voltage Vd0. That is, the first driving signal P1 is at a high level. While the reference signal P0 input to the first input terminal 33 is at a low level (approximately ground voltage V0), the NPN transistor 31 is in an OFF state, the PNP transistor 32 is in an ON state. The voltage of the first output terminal 34 thus becomes the ground voltage V0. That is, the first driving signal P1 is at a low level. Consequently, the first driving signal P1 based on the low level of the reference signal P0 is output to the second signal output unit 40 from the first output terminal 34.

The second signal output unit 40 is configured to generate a second driving signal P2, which is a pulsed signal, on the basis of the first driving signal P1 input from the first signal output unit 30 and then output the second driving signal P2 to the switching element 200. Specifically, the second signal output unit 40 is constructed of an isolated gate driver including a push-pull circuit of an NPN transistor 41 and a PNP transistor 42 and an insulated gate driver including a photocoupler 45. The second signal output unit 40 also includes a second input terminal 43 and a second output terminal 44.

Bases of the NPN transistor 41 and the PNP transistor 42 are connected to each other and also to the secondary side (light receiving side) of the photocoupler 45. Emitters of the NPN transistor 41 and the PNP transistor 42 are connected to each other, and the midpoint therebetween is connected to the second output terminal 44. A collector of the NPN transistor 41 is connected to the positive electrode of the DC power supply 100, and a collector of the PNP transistor 42 is connected to the negative power supply generating unit 50.

The photocoupler 45 includes a light emitting diode (light emitting element) 45a on its primary side (light emitting side). An anode of the light emitting diode 45a is connected to the second input terminal 43, and a cathode of the light emitting diode 45a is connected to the ground GND. Thus, the light emitting diode 45a emits light when the first driving signal P1 input to the second input terminal 43 is at the high level. Although its depiction is omitted, the secondary side (light receiving side) of the photocoupler 45 includes a light receiving element such as a photodiode and is configured to apply a predetermined voltage to the bases of the NPN transistor 41 and the PNP transistor 42 upon receipt of light from the light emitting diode 45a.

The second input terminal 43 is connected to the first output terminal 34 of the first signal output unit 30 via a first adjusting resistor 60. Accordingly, the first driving signal P1, which has been adjusted to have a voltage Vd1' by the first adjusting resistor 60, is input to the second input terminal 43. The second output terminal 44 is connected to a control terminal (gate) 202 of the switching element 200 via a second adjusting resistor 62.

With such configurations, the NPN transistor 41 is in an ON state and the PNP transistor 42 is in an OFF state in the second signal output unit 40 while the pulsed first driving signal P1 input to the second input terminal 43 is at the high level (voltage Vd1'). Accordingly, the voltage of the second output terminal 44 receives the input voltage Vcc and thus becomes a voltage Vd2 based on the voltage Vd1'. That is, the second driving signal P2 is at a high level. While the first driving signal P1 input to the second input terminal 43 is at the low level (approximately ground voltage V0), the NPN transistor 41 is in an OFF state, the PNP transistor 42 is in an ON state, and the second output terminal 44 is connected to the negative power supply generating unit 50 via the PNP transistor 42. Consequently, the voltage of the second output terminal 44 becomes a negative voltage −Vn relative to the ground voltage V0 by the negative power supply generating unit 50, although its details will be described later. That is, the second driving signal P2 is at a low level. Consequently, the second driving signal P2 with the high level thereof being defined by the first driving signal P1 and the low level thereof being biased toward the negative side by the negative power supply generating unit 50 is output to the control terminal 202 of the switching element 200 from the second output terminal 44.

In other words, the self-turn-on phenomenon is prevented from occurring in the present embodiment by biasing the gate voltage of the switching element 200 in an OFF state toward more negative side than the ground voltage V0. The control terminal 202 of the switching element 200 is connected to the ground GND via a third adjusting resistor 64, and the resistance value of the third adjusting resistor 64 is set sufficiently larger than the resistance value of the second adjusting resistor 62. Thus, according to the second driving signal P2, the gate voltage of the switching element 200 is divided by the second adjusting resistor 62 and the third adjusting resistor 64. When the second driving signal P2 is at the high level, the voltage becomes a voltage Vd2'. When the second driving signal P2 is at the low level, on the other hand, the voltage becomes a negative voltage −Vn' relative to the ground voltage V0.

As described above, the negative power supply generating unit 50 is configured to generate the negative voltage −Vn relative to the ground voltage VO and bias the low level of the second driving signal P2 toward the negative side. In other words, the negative power supply generating unit 50 is configured to apply the negative voltage to the control terminal 202 via the second output terminal 44 when the switching element 200 is in an OFF state so as to bias the gate voltage of the switching element 200 in the OFF state toward the negative side. The negative power supply generating unit 50 includes a first capacitor 51, a second capacitor 52, a first diode 53, a second diode 54, and a limiting resistor 55.

The first capacitor 51 is configured to generate a positive primary voltage Vp relative to the ground voltage VO due to charge storage (i.e., charging) by the first driving signal P1. The second capacitor 52 is configured to generate the negative voltage −Vn relative to the ground voltage VO due to charge transfer from the first capacitor 51 (i.e., being charged by the discharge of the first capacitor). The first diode 53 and the second diode 54 are configured to rectify current flowing during the charge storage to the first capacitor 51 and the second capacitor 52. The limiting resistor 55 is configured to adjust a charge amount (i.e., a charging amount) stored in the second capacitor 52.

Specifically, one end of the first capacitor 51 is connected to the first output terminal 34 of the first signal output unit 30 via the limiting resistor 55, and the other end thereof is connected to the midpoint between the first diode 53 and the second diode 54. One end of the second capacitor 52 is connected to the ground GND, and the other end thereof is connected to an anode of the second diode 54 and the collector of the PNP transistor 42 in the second signal output unit 40.

The first diode 53 and the second diode 54 are connected in series with an anode of the first diode 53 and a cathode of the second diode 54 being connected to each other. A cathode of the first diode 53 is connected to the ground GND, and the anode of the second diode 54 is connected to the midpoint between the other end of the second capacitor 52 and the collector of the PNP transistor 42 in the second signal output unit 40. One end of the limiting resistor 55 is connected to the midpoint between the first output terminal 34 of the first signal output unit 30 and the first adjusting resistor 60, and the other end thereof is connected to the one end of the first capacitor 51.

Next, operations of the switch driving device 1 will be described in detail. FIGS. 2 to 5 are circuit diagrams showing the flow of current in the operations of the switch driving device 1. Note that the flow of current is indicated by an alternate long and short dash line in these figures.

Figure 2:
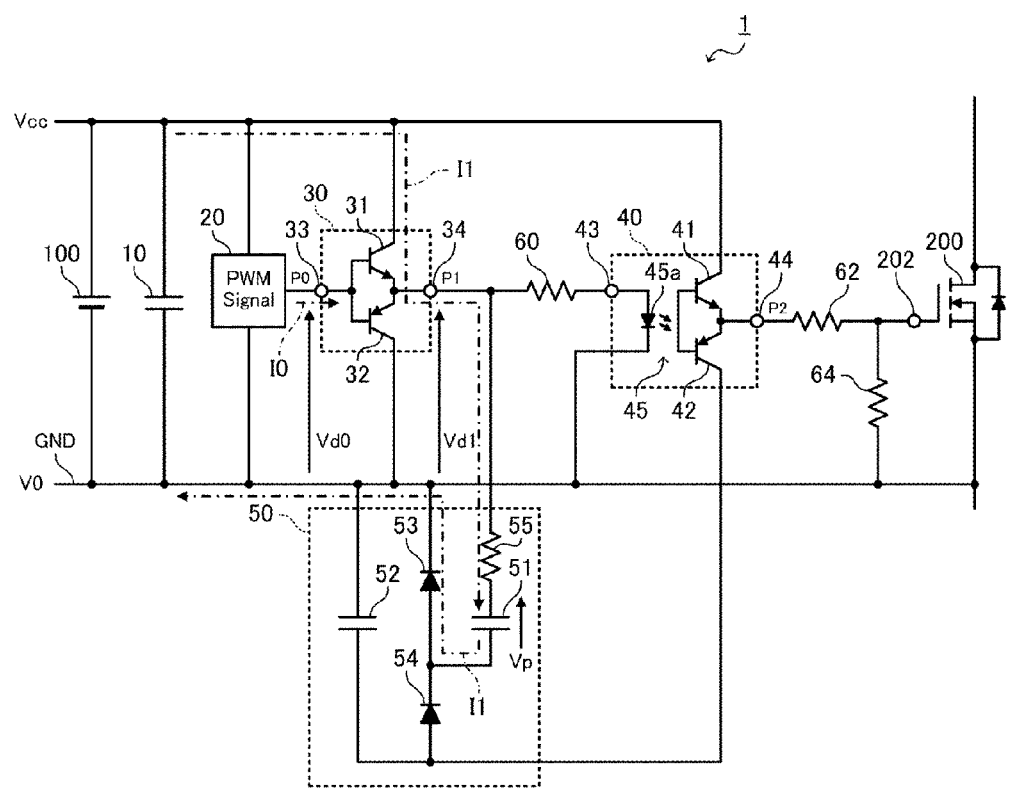
FIG. 2 is a circuit diagram showing the flow of current in operations of the switch driving device.

As described above, the pulse generating unit 20 generates the reference signal PO having a pulse width modulated in accordance with an instruction from an external control device, for example, and then outputs the reference signal PO to the first input terminal 33 of the first signal output unit 30. Once the pulse generating unit 20 causes the reference signal PO to rise from the low level to the high level and thus a current I0 flows into the first input terminal from the pulse generating unit 20 as illustrated in FIG. 2, the voltage Vd0 is applied to the first input terminal 33. This makes the NPN transistor 31 ON and the PNP transistor 32 OFF. Thus, a current I1 first flows through the NPN transistor 31.

Specifically, as illustrated in FIG. 2, the current I1 flows from the positive electrode of the DC power supply 100 and one end of the input capacitor 10 into the one end of the first capacitor 51 via the NPN transistor 31, the first output terminal 34, and the limiting resistor 55, and then returns to a negative electrode of the DC power supply 100 and the other end of the input capacitor 10 from the other end of the first capacitor 51 via the first diode 53 and the ground GND. Consequently, the one end (the terminal closer to the limiting resistor 55) of the first capacitor 51 has a positive potential, and the other end (the terminal closer to the first diode 53) thereof has a negative potential. A predetermined amount of charge is thus stored (charged) in the first capacitor 51. A voltage across the terminals of the first capacitor 51 is the primary voltage Vp based on the voltage Vd1 at the first output terminal 34 and the resistance value of the limiting resistor 55. Note that this primary voltage Vp is positive relative to the ground voltage V0.

Figure 3:
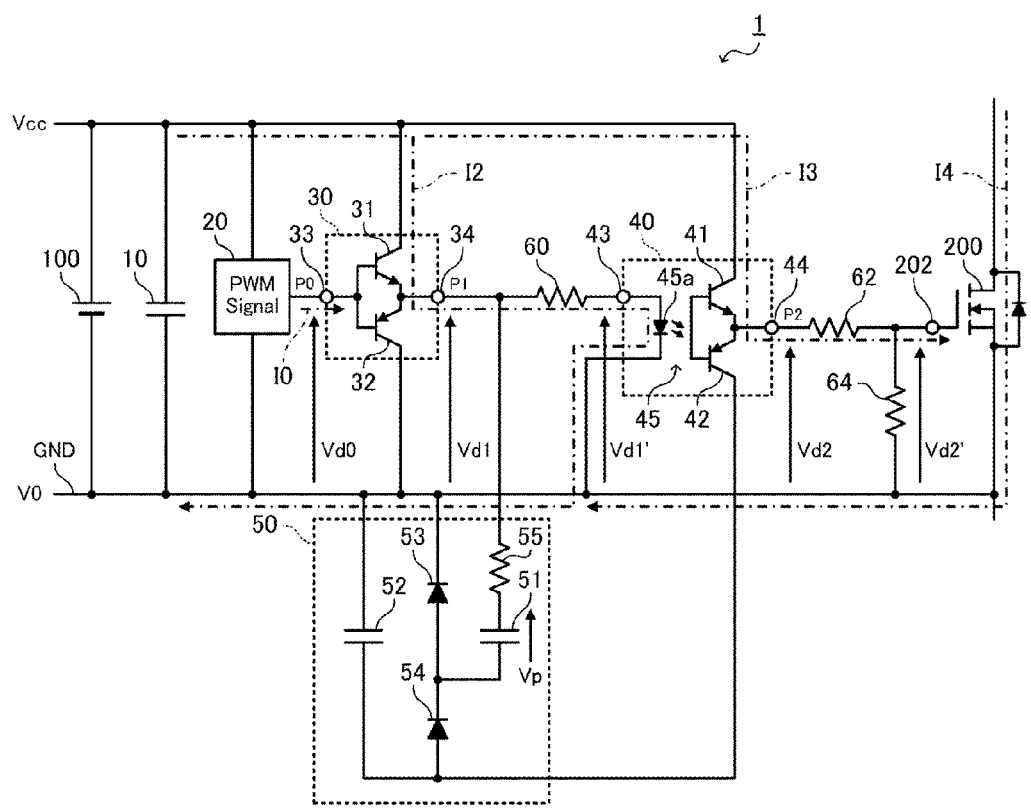
FIG. 3 is a circuit diagram showing the flow of current in operations of the switch driving device.

Once the charge is stored in the first capacitor 51, the current inflow to the first capacitor 51 stops. Consequently, approximately all of the current having passed through the NPN transistor 31 and having flowed out from the first output terminal 34 flows into the second input terminal 43 of the second signal output unit 40 via the first adjusting resistor 60. In other words, a current I2 flows from the positive electrode of the DC power supply 100 and the one end of the input capacitor 10 into the second input terminal 43 via the NPN transistor 31, the first output terminal 34, and the first adjusting resistor 60 as illustrated in FIG. 3. This causes the first driving signal P1 to rise from the low level to the high level, thus applying the voltage Vd1' to the second input terminal 43. In other words, the negative power supply generating unit 50 is configured so that charge is stored in the first capacitor 51 by the energy discharged from the high-level potential of the first driving signal P1 with the rising edge of the first driving signal P1 serving as a trigger.

The current I2 having flowed into the second input terminal 43 passes through the light emitting diode 45a and then returns to the negative electrode of the DC power supply 100 and the other end of the input capacitor 10 via the ground GND, thereby lighting the light emitting diode 45a. This makes the NPN transistor 41 in the second signal output unit 40 ON and the PNP transistor 42 OFF. Consequently, a current I3 flows from the positive electrode of the DC power supply 100 and the one end of the input capacitor 10 into the control terminal 202 of the switching element 200 via the NPN transistor 41, the second output terminal 44, and the second adjusting resistor 62 as illustrated in FIG. 3. That is, this causes the second driving signal P2 to rise from the low level to the high level, thus applying the voltage Vd2' to the control terminal 202. Consequently, the switching element 200 is turned ON, and thus a current I4 flows through the drain and source of the switching element 200.

Figure 4:
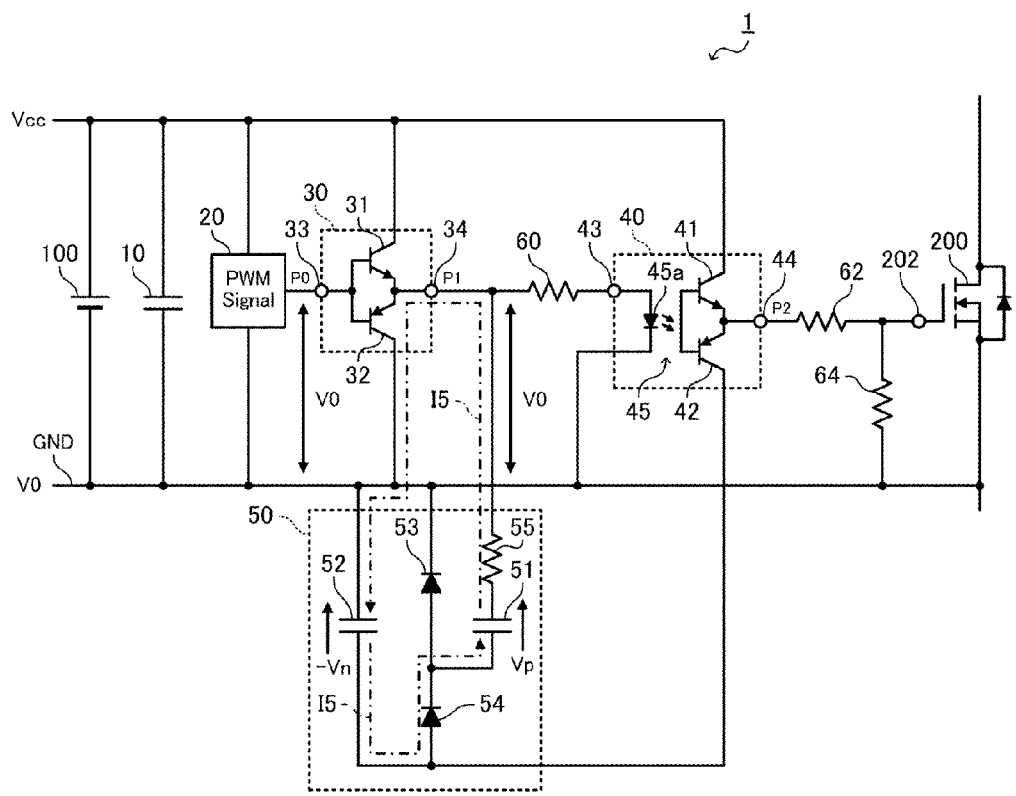
FIG. 4 is a circuit diagram showing the flow of current in operations of the switch driving device.

The ON state of the switching element 200 continues for approximately the same period as the period during which the reference signal P0 is at the high level. Once the pulse generating unit 20 causes the reference signal P0 to fall from the high level to the low level in accordance with an instruction from an external control device, for example, and thus the flow of the current I0 stops, the voltage of the first input terminal 33 in the first signal output unit 30 becomes approximately the ground voltage V0 as illustrated in FIG. 4. This makes the NPN transistor 31 in the first signal output unit 30 OFF and the PNP transistor 32 ON. Consequently, no current I2 flows, and thus the voltages of the first output terminal 34 and the second input terminal 43 become approximately the ground voltage V0. That is, the first driving signal P1 is at the low level.

At this time, the PNP transistor 32 of the first signal output unit 30 is turned ON, and the first capacitor 51 and the second capacitor 52 in the negative power supply generating unit 50 are thereby short-circuited via the limiting resistor 55 and form a closed circuit. Consequently, charge is transferred from the first capacitor 51 to the second capacitor 52 (the first capacitor 51 is discharged and the second capacitor 52 is charged). Along with this charge transfer, a current I5 flows. Specifically, the current I5 flows from the one end of the first capacitor 51 into the one end of the second capacitor 52 via the limiting resistor 55, the first output terminal 34, the PNP transistor 32, and the ground GND and then returns to the other end of the first capacitor 51 from the other end of the second capacitor 52 via the second diode 54. Consequently, the one end (the terminal closer to the ground GND) of the second capacitor 52 has a positive potential, and the other end (the terminal closer to the second diode 54) thereof has a negative potential. Charge is thus stored (charged) in the second capacitor 52. In other words, the negative power supply generating unit 50 is configured so that the charge emitted from the first capacitor 51 is stored in the second capacitor 52 due to the force of attraction by the low-level potential of the first driving signal P1 with the falling edge of the first driving signal P1 serving as a trigger.

Due to the ground GND interposed between the first capacitor 51 and the second capacitor 52, a voltage across the terminals of the second capacitor 52 becomes the negative voltage −Vn with the ground voltage V0 having a high potential. Furthermore, the magnitude of the negative voltage −Vn is dependent on the resistance value of the limiting resistor 55 interposed between the first capacitor 51 and the second capacitor 52. In other words, the magnitude of the negative voltage −Vn can be appropriately adjusted by the resistance value of the limiting resistor 55 in the present embodiment.

Figure 5:
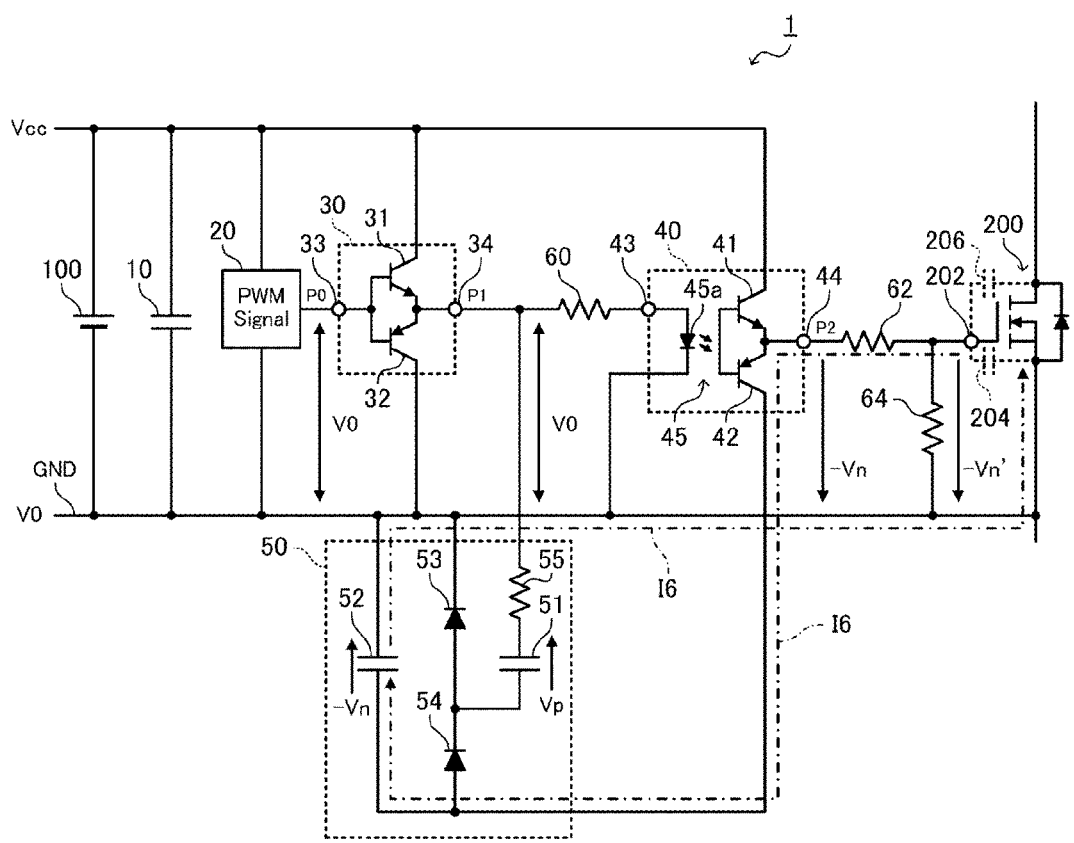
FIG. 5 is a circuit diagram showing the flow of current in operations of the switch driving device.

Once the first driving signal P1 is changed to the low level and thus the voltage of the second input terminal 43 in the second signal output unit 40 becomes approximately the ground voltage V0, the NPN transistor 41 in the second signal output unit 40 is turned OFF and the PNP transistor 42 is turned ON. Consequently, no current I3 flows. Moreover, the PNP transistor 42 in the ON state causes the second output terminal 44 and the control terminal 202 of the switching element 200 to be connected to the second capacitor 52. Thus, the second capacitor 52 and gate-source capacitance 204, which is parasitic capacitance of the switching element 200, are short-circuited via the second adjusting resistor 62 and form a closed circuit as illustrated in FIG. 5.

The voltage across the terminals of the second capacitor 52 is the negative voltage −Vn with the ground voltage V0 having a high potential, and the polarity of the charge stored in the second capacitor 52 is opposite to the polarity of charge stored in the gate-source capacitance 204 during the ON period of the switching element 200. Accordingly, when the closed circuit is formed, a current I6 flows in a direction indicated in FIG. 5 along with the charge transfer. Moreover, since the gate-source capacitance 204 is capacitance parasitic in the element, the gate-source capacitance 204 has a sufficiently small capacitance value as compared to the second capacitor 52 and an amount of charge stored therein is sufficiently smaller than the amount of charge stored in the second capacitor 52. Therefore, the charge stored in the gate-source capacitance 204 disappears together with the generation of the current I6 flowing through the closed circuit. The energy of such charge is consumed by the second adjusting resistor 62 or the like when disappeared. After the disappearance of the charge stored in the gate-source capacitance 204, approximately the negative voltage −Vn is applied to the second output terminal 44 by a sufficiently large amount of charge left in the second capacitor 52, and at the same time the control terminal 202 has the applied negative voltage −Vn'. In other words, the second driving signal P2 has the low level biased toward the negative side, and thus the switching element 200 is turned OFF.

When the switching element 200 is turned OFF, a drain-source voltage of the switching element 200 sharply rises from approximately the ground voltage V0 in the ON period. This causes charge to be injected into the gate-source capacitance 204 via drain-gate capacitance 206, which is parasitic capacitance (the gate-source capacitance 204 is charged). The polarity of the charge stored in the gate-source capacitance 204 due to the charge injection via the drain-gate capacitance 206 is in a direction to raise the voltage of the control terminal 202 (gate) (to bias such a voltage toward the positive side). This polarity is opposite to the polarity of the charge stored in the second capacitor 52 that applies the negative voltage −Vn' to the control terminal 202. Therefore, also for the charge injection into the gate-source capacitance 204 via the drain-gate capacitance 206, the current I6 accompanied by the charge transfer flows in the direction indicated in FIG. 5. Consequently, the charge injected via the drain-gate capacitance 206 disappears due to coupling, thereby preventing charge storage in the gate-source capacitance 204.

Although the OFF state of the switching element 200 continues for approximately the same period as the period during which the reference signal P0 is at the low level, the PNP transistor 32 of the first signal output unit 30 is kept in the ON state during such a period. Thus, the first capacitor 51 and the second capacitor 52 are kept in the short-circuited state by the PNP transistor 32. More specifically, the charge transfer from the first capacitor 51 to the second capacitor 52 continues during the OFF period of the switching element 200. Thus, by setting the capacitance value of the first capacitor 51 to be sufficiently larger than the capacitance value of the second capacitor 52, the voltage across the terminals of the second capacitor 52 can be maintained at approximately the negative voltage −Vn by the charge transfer from the first capacitor 51 even when the charge amount in the second capacitor 52 is substantially decreased.

In other words, the voltage of the control terminal 202, i.e., the gate voltage can be stably maintained at the negative voltage −Vn' in the present embodiment because the second capacitor 52 is constantly backed up by the first capacitor 51 during the OFF period of the switching element 200. This allows the gate voltage to be stably kept below a threshold voltage, thereby enabling the reliable prevention of the self-turn-on phenomenon in the switching element 200.

Subsequently, the switch driving device 1 repeats the above-described operation so that the switching element 200 is driven ON and OFF at a time ratio in accordance with an instruction from an external control device, for example.

In the present embodiment, charge is stored (charged) in the first capacitor 51 by the first driving signal P1 and charge is stored (charged) in the second capacitor 52 by the charge transfer (discharge) from the first capacitor 51 having stored the charge as described above. This allows for the generation of the negative voltage −Vn without insulation from the DC power supply 100 by a transformer or the like. Moreover, connection and disconnection of the first capacitor 51 and the second capacitor 52 can be switched by ON and OFF of the PNP transistor 32 in the first signal output unit 30 and ON and OFF of the PNP transistor 42 in the second signal output unit 40. This allows the negative voltage −Vn to be generated without separately providing, for example, a dedicated switch and allows the low level of the second driving signal P2 to be biased toward the negative side. In other words, the present embodiment enables the reliable prevention of the self-turn-on phenomenon in the switching element 200 in spite of the simple and compact configuration.

Figure 6:
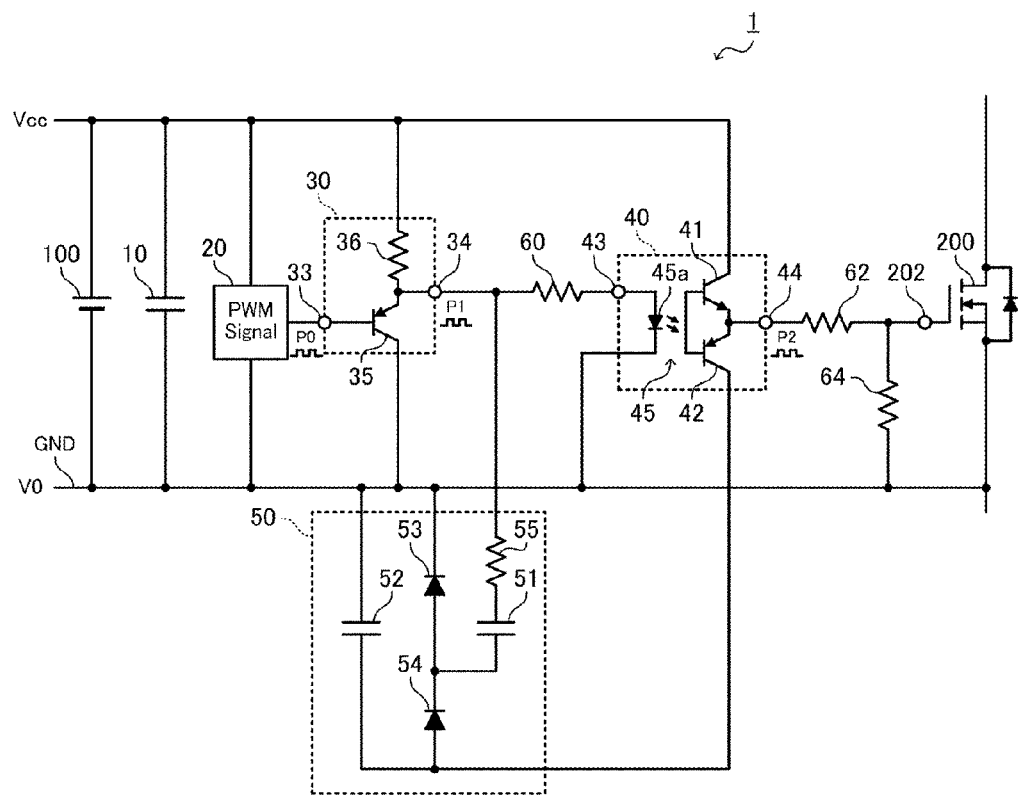
FIG. 6 is a circuit diagram showing another configuration example of the switch driving device.
Figure 7:
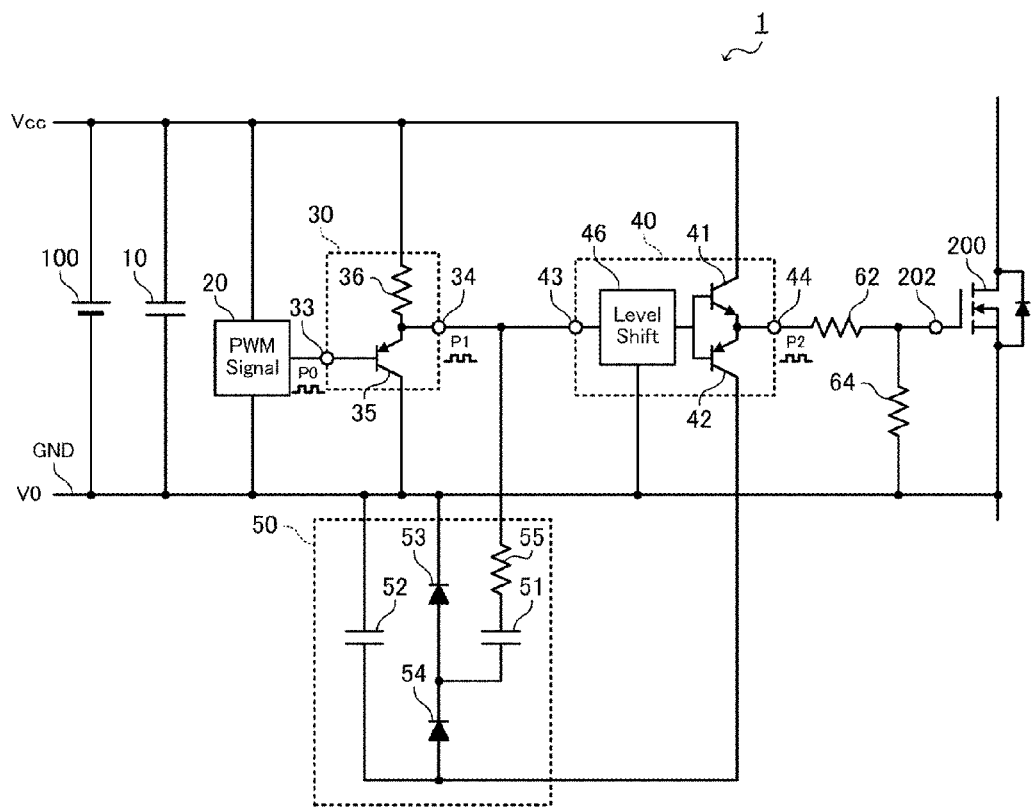
FIG. 7 is a circuit diagram showing still another configuration example of the switch driving device.
Figure 8:
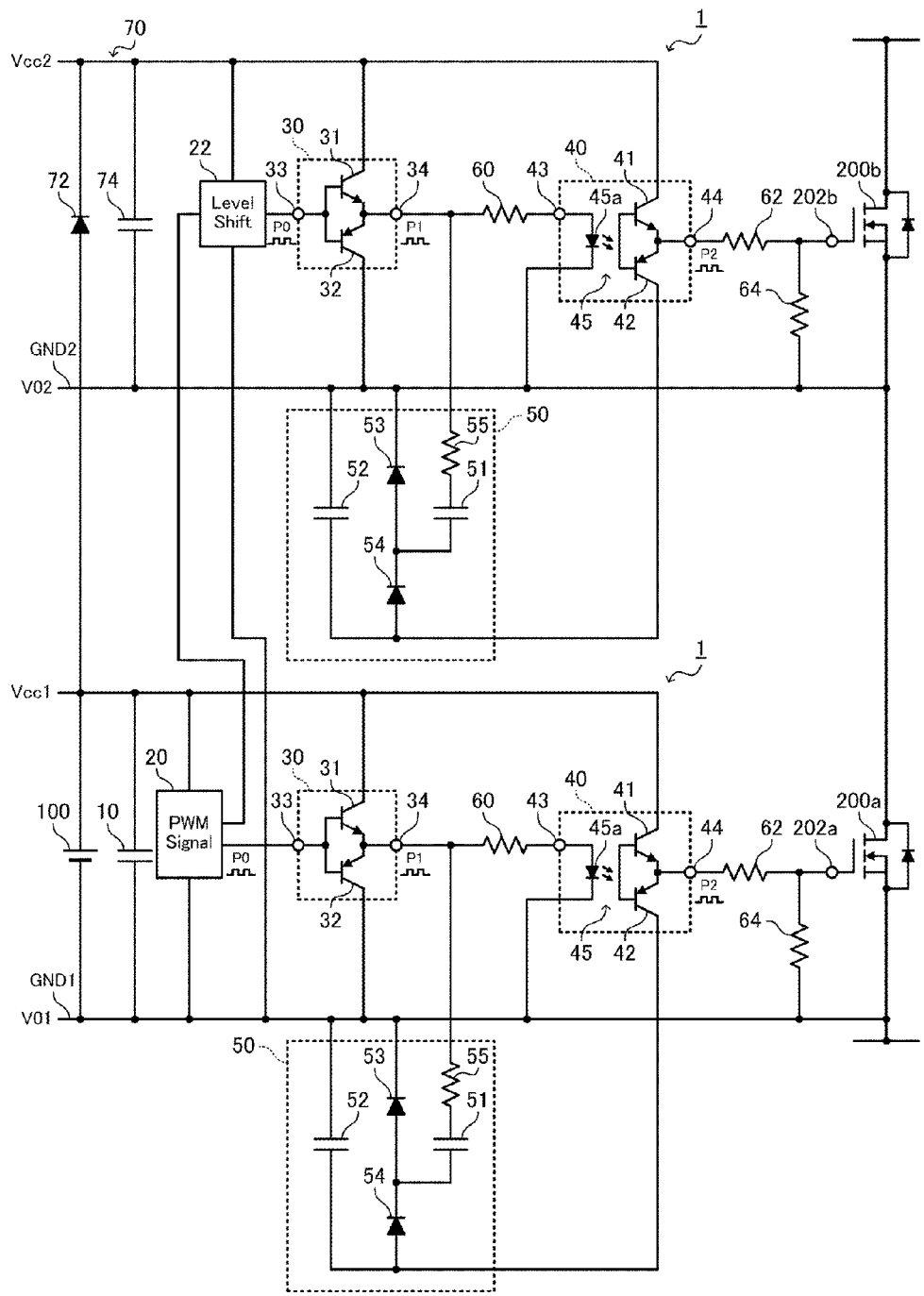
FIG. 8 is a circuit diagram showing still another configuration example of the switch driving device.

Other configurations of the switch driving device 1 will be described next. FIGS. 6 to 8 are circuit diagrams showing other configuration examples of the switch driving device 1.

FIG. 6 shows an example in which the first signal output unit 30 is constructed of an open collector circuit. The first signal output unit 30 in this example has a resistor 36 in place of the NPN transistor 31. One end of the resistor 36 is connected to the positive electrode of the DC power supply 100 and the other end thereof is connected to the emitter of the PNP transistor 35. The base of the PNP transistor 35 is connected to the first input terminal 33, the emitter of the PNP transistor 35 and the other end of the resistor 36 are connected to the first output terminal 34, and the collector of the PNP transistor 35 is connected to the ground GND. Effects similar to those described above can be obtained also when the first signal output unit 30 is constructed in such a manner. Note that the push-pull circuit in the second signal output unit 40 may be replaced by an open collector circuit.

FIG. 7 shows an example in which a level shift circuit 46 is provided in place of the photocoupler 45 in the second signal output unit 40. In this case, a voltage applied to the second input terminal 43 is applied to the bases of the NPN transistor 41 and the PNP transistor 42 after the signal level thereof is converted by the level shift circuit 46. As just described, the second signal output unit 40 may not be insulated from the first driving signal P1. This case also enables the achievement of the effects similar to those described above. Although the first signal output unit 30 is constructed of an open collector circuit in the example shown in FIG. 7, the first signal output unit 30 may be constructed of a push-pull circuit.

Furthermore, the first signal output unit 30 and the second signal output unit 40 may include other transistors such as FETs or IGBTs in place of the NPN transistors 31 and 41 and the PNP transistors 32, 42, and 35, although their depiction is omitted. The limiting resistor 55 may be provided between the second capacitor 52 and the PNP transistor 32 and 35, or may be provided between the first capacitor 51 and the first output terminal 34 as well as between the second capacitor 52 and the PNP transistor 32 and 35. Alternatively, the one end of the first capacitor 51 may be connected to the midpoint between the first adjusting resistor 60 and the second input terminal 43 so that the first adjusting resistor 60 doubles with the limiting resistor 55. The switch driving device 1 may be provided in various devices other than switching power supply devices. Needless to say, the switching element 200 driven by the switch driving device 1 may be any of various switching elements other than MOSFETs.

FIG. 8 shows an example in which the switch driving device 1 is provided on both a low side and a high side in a switching power supply device including a first switching element 200a on the low side and a second switching element 200b on the high side. In this example, components on the low side are connected to first ground GND1, and components on the high side are connected to second ground GND2. The potential of the first ground GND1 (first ground voltage V01) may be different from, or the same as, the potential of the second ground GND2 (second ground voltage V02).

In this example, a first input voltage Vcc1 is input from the DC power supply 100 on the low side, and a second input voltage Vcc2, which is higher than the first input voltage Vcc1, is input from the DC power supply 100 via a bootstrap circuit 70 on the high side. In other words, this example is configured so that power is supplied to both the low side and the high side from the single DC power supply 100. The bootstrap circuit 70 is constructed of a boot diode 72 and a boot capacitor 74. An anode of the boot diode 72 is connected to the positive electrode of the DC power supply 100, and a cathode thereof is connected to one end of the boot capacitor 74. The other end of the boot capacitor 74 is connected to the second ground GND2.

Furthermore, in this example, the reference signal P0 is output to both the first signal output unit 30 on the low side and the first signal output unit 30 on the high side from the single pulse generating unit 20 provided on the low side. Note that a level shift circuit 22 is provided between the pulse generating unit 20 and the first signal output unit 30 on the high side, so that the reference signal PO is input to the first signal output unit 30 on the high side after the signal level thereof is converted by the level shift circuit 22.

Since the negative voltage −Vn is generated through the use of the first driving signal P1 in the switch driving device 1 of the present embodiment, the switch driving device 1 can be applied not only to both of the low side and the high side but also to the high side in which power is supplied by the bootstrap circuit 70. In other words, regardless of the configuration of the switching power supply device, the switch driving device 1 allows the negative voltage −Vn' to be applied to control terminals 202a and 202b in the first switching element 200a on the low side and the second switching element 200b on the high side with the simple and compact configuration. Thus, the self-turn-on phenomenon can be reliably prevented from occurring.

As described above, the switch driving device 1 of the present embodiment includes: the first signal output unit 30 configured to output the pulsed first driving signal P1 from the first output terminal 34; the second signal output unit 40 configured to output the pulsed second driving signal P2 to the control terminal 202 of the switching element 200 from the second output terminal 44 on the basis of the input first driving signal P1; and the negative power supply generating unit 50 configured to generate the negative voltage −Vn relative to the ground voltage V0 and bias the low level of the second driving signal P2 toward the negative side by the negative voltage −Vn. The negative power supply generating unit 50 includes: the first capacitor 51 configured to store charge by the first driving signal P1; and the second capacitor 52 configured to generate the negative voltage −Vn across the terminals thereof by the transfer of the charge from the first capacitor 51.

In the switch driving device 1 including: the first signal output unit 30 configured to output the pulsed first driving signal P1 from the first output terminal 34; and the second signal output unit 40 configured to output the pulsed second driving signal P2 to the control terminal 202 of the switching element 200 from the second output terminal 44 on the basis of the input first driving signal P1, the switch driving method of the present embodiment includes: storing charge in the first capacitor 51 by the first driving signal P1; generating the negative voltage −Vn relative to the ground voltage V0 across the terminals of the second capacitor 52 by transferring the charge from the first capacitor 51 to the second capacitor 52; and biasing the low level of the second driving signal P2 toward the negative side by the negative voltage −Vn.

Such a configuration allows the negative voltage −Vn to be generated without providing, for example, a transformer or a dedicated switch for generating the negative voltage −Vn and allows the low level of the second driving signal P2 to be biased toward the negative side. Thus, the self-turn-on phenomenon in the switching element 200 can be reliably prevented from occurring in spite of such a simple and compact configuration.

The first signal output unit 30 includes the first transistor (PNP transistor 32) having the current entering terminal (emitter) that is connected to the first output terminal 34. The one end of the first capacitor 51 is connected to the current entering terminal of the first transistor via the first output terminal 34, and the one end of the second capacitor 52 is connected to the current exiting terminal (collector) of the first transistor. Such a configuration enables switching between the operation of storing (charging) charge in the first capacitor 51 by utilizing the first transistor configured to generate the first driving signal P1 and the operation of transferring the charge from the first capacitor 51 to the second capacitor 52. This allows for the simple and compact configuration of the negative power supply generating unit 50.

The negative power supply generating unit 50 includes the first diode 53 and the second diode 54. The anode of the first diode 53 is connected to the other end of the first capacitor 51, and the cathode thereof is connected to the ground GND. The anode of the second diode 54 is connected to the other end of the second capacitor 52, and the cathode thereof is connected to the other end of the first capacitor 51. The midpoint between the second capacitor 52 and the first transistor (PNP transistor 32) is connected to the ground GND. Such a configuration allows the voltage across the terminals of the first capacitor 51 in which charge is stored (charged) by the first driving signal P1 to be the positive primary voltage Vp and allows the voltage across the terminals of the second capacitor 52 to which the charge has been transferred from the first capacitor 51 to be the negative voltage −Vn. Thus, the negative voltage −Vn can be generated with such a simple and compact configuration.

The second signal output unit 40 includes the second transistor (PNP transistor 42) having the current entering terminal (emitter) that is connected to the second output terminal 44, and the midpoint between the second capacitor 52 and the second diode 54 is connected to the current exiting terminal (collector) of the second transistor. Such a configuration enables switching between connection and disconnection of the second capacitor 52 to and from the control terminal 202 of the switching element 200 by utilizing the second transistor configured to generate the second driving signal P2. This allows for the simple and compact configuration of the negative power supply generating unit 50.

The negative power supply generating unit 50 includes the limiting resistor 55 provided between the first capacitor 51 and the second capacitor 52. Such a configuration enables adjustment in the magnitude of the negative voltage −Vn by the resistance value of the limiting resistor 55. Thus, the self-turn-on phenomenon in the switching element 200 can be reliably prevented from occurring and the versatility of the switch driving device 1 can be improved.

While the embodiments of the present invention have been described above, it is to be understood that the switch driving device and the switch driving method according to the present invention are not limited to the aforementioned embodiments and various modifications thereeof may be made without departing from the scope of the present invention. The functions and effects described in the aforementioned embodiments are merely the recitation of the most preferred functions and effects that can be obtained by the present invention. Functions and effects of the present invention are not limited thereto.

The switch driving device and the switch driving method of the present invention can be utilized in the field of various electrical and electronic devices.

The entire disclosure of Japanese Patent Application No. 2014-203827 filed Oct. 15, 2015 including specification, claims, drawings, and summary are incorporated herein by reference in its entirety.

What is claimed is:
1. A switch driving device comprising:
a first signal output unit configured to output a pulsed first driving signal from a first output terminal thereof;
a second signal output unit configured to output a pulsed second driving signal to a control terminal of a switching element from a second output terminal thereof on a basis of the input first driving signal; and a negative power supply generating unit configured to generate a negative voltage relative to a ground voltage and bias a low level of the second driving signal toward a negative side by the negative voltage, wherein the negative power supply generating unit includes:

a first capacitor configured to store charge by the first driving signal; and a second capacitor configured to generate the negative voltage across terminals thereof by transfer of the charge from the first capacitor.

2. The switch driving device according to claim 1, wherein the first signal output unit includes a first transistor having a current exiting terminal and a current entering terminal that is connected to the first output terminal, the first capacitor has one end that is connected to the current entering terminal of the first transistor via the first output terminal, and the second capacitor has one end that is connected to the current exiting terminal of the first transistor.

3. The switch driving device according to claim 2, wherein the negative power supply generating unit includes a first diode and a second diode, the first diode has an anode that is connected to the other end of the first capacitor and a cathode that is connected to a ground, the second diode has an anode that is connected to the other end of the second capacitor and a cathode that is connected to the other end of the first capacitor, and a midpoint between the second capacitor and the first transistor is connected to the ground.

4. The switch driving device according to claim 3, wherein the second signal output unit includes a second transistor having a current exiting terminal and a current entering terminal that is connected to the second output terminal, and a midpoint between the second capacitor and the second diode is connected to the current exiting terminal of the second transistor.

5. The switch driving device according to claim 2, wherein the negative power supply generating unit includes a limiting resistor provided between the first capacitor and the second capacitor.

6. The switch driving device according to claim 3, wherein the negative power supply generating unit includes a limiting resistor provided between the first capacitor and the second capacitor.

7. The switch driving device according to claim 4, wherein the negative power supply generating unit includes a limiting resistor provided between the first capacitor and the second capacitor.

8. A switch driving method performed in a switch driving device including: a first signal output unit configured to output a pulsed first driving signal from a first output terminal thereof; and a second signal output unit configured to output a pulsed second driving signal to a control terminal of a switching element from a second output terminal thereof on a basis of the input first driving signal, the switch driving method comprising:

storing charge in a first capacitor by the first driving signal;

generating a negative voltage relative to a ground voltage across terminals of a second capacitor by transferring the charge from the first capacitor to the second capacitor; and biasing a low level of the second driving signal toward a negative side by the negative voltage.

* * * * *